US007003363B1

(12) United States Patent
Gadiel et al.

(10) Patent No.: US 7,003,363 B1
(45) Date of Patent: Feb. 21, 2006

(54) FREEFORM MODELING METHOD AND SYSTEM

(75) Inventors: Frank-Ulrich Gadiel, Hannover (DE); Günter Sonnenberg, Wendeburg (DE); Hans Polke, Lehrte (DE)

(73) Assignee: Dassault Systemes, Suresnes Cedex (FR)

( * ) Notice: Subject to any disclaimer, the term of this patent is extended or adjusted under 35 U.S.C. 154(b) by 44 days.

(21) Appl. No.: 09/680,774

(22) Filed: Oct. 6, 2000

(51) Int. Cl.
*G06F 19/00* (2006.01)

(52) U.S. Cl. ........................................ 700/98; 345/420
(58) Field of Classification Search ................. 700/98, 700/97, 83, 180–182; 345/418–420, 423, 345/850, 964; 707/8; 717/128; 703/1, 2; 715/964

See application file for complete search history.

(56) References Cited

U.S. PATENT DOCUMENTS

| | | | | |
|---|---|---|---|---|
| 5,481,659 A | * | 1/1996 | Nosaka et al. | 345/423 |
| 5,526,517 A | * | 6/1996 | Jones et al. | 707/8 |
| 5,821,925 A | | 10/1998 | Carey et al. | 245/757 |
| 5,844,563 A | * | 12/1998 | Harada et al. | 345/420 |
| 5,923,573 A | * | 7/1999 | Hatanaka | 703/2 |
| 5,960,199 A | * | 9/1999 | Brodsky et al. | 717/128 |

OTHER PUBLICATIONS

M. Gleicher, "A Graphics Tookit Based on Differential Constraints," *UIST'93 Proceedings of the Annual ACM Symposium on User Interface Software and Technology*, Nov. 3, 1993, pp. 109-120.

A. Inozemtsev et al., "Parametric Modelling: Concept and Implementation," *Information Visualization, 2000*, Jul. 19, 2000, pp. 504-509.

S. Urban et al., "An Overview of the ASU Engineering Database Project: Interoperability in Engineering Design," *Research Issues in Data Engineering, 1993*, Apr. 19, 1993, pp. 73-76.

S. Crest, "Simplifying Life with Flowcharts," *Metal Finishing*, Jun. 1999, pp. 135-136.

M. Honda et al., "Integrated Manipulation: Context-aware Manipulation of 2D Diagrams," *UIST. Proceedings of the Annual ACM Symposium on User Interface Software and Technology*, Nov. 1999, pp. 159-160.

L. Eggli et al., "Inferring 3D models from freehand sketches and constraints," *Computer-Aided Design*, Feb. 1, 1997, pp. 101-112.

(Continued)

*Primary Examiner*—Leo Picard
*Assistant Examiner*—Steven R. Garland
(74) *Attorney, Agent, or Firm*—James V. Mahon; Clifford Chance US LLP

(57) ABSTRACT

In a CAD/CAM system providing freeform modeling of solids and surface, commands for modifying the geometry of an object can be designated to run concurrently, so as to reduce the number of steps required of the user in the design process. A command (or commands) can be designated as associative, so that the command is performed automatically whenever the geometry to which it is attached is modified. This leads to a further streamlining of the design process. The user may store an interactive scene as it is at any given time, with the current selections and tool representations, so that the work can be resumed later without the user having to redo interactions. With that, and in relation to parallel and associative commands, the system allows the user to capture all design constraints and dependencies throughout the whole lifetime of a design model.

15 Claims, 7 Drawing Sheets

OTHER PUBLICATIONS

J. Chung et al., "Framework for integrated mechanical design automation," *Computer-Aided Design*, May 2000, pp. 355-365.

J. Noble, "Objects and Constraints," *Technology of Object-Oriented Languages*, Nov. 23, 1998, pp. 75-87.

C. Hsu et al., "A Constraint-based Manipulator Toolset for Editing 3D Objects," *Proceedings of the Fourth Symposium on Solid Modeling and Applications*, May 14, 1997, pp. 168-180.

W. Sohrt et al., "Interaction with Constraints in 3D Modeling," *Proceedings. Symposium on Solid Modeling Foundations and CAD/CAM Applications*, Jun. 5, 1991, pp. 387-396.

* cited by examiner

Traditional Class A System (no parallel commands)

| User | Commands |
|---|---|
| 1) Select "Extrapolation" command. | ▷ Activate "Extrapolation" command. |
| 2) Select patch 1. | ▷ Mark patch 1 for extrapolation command. |
| 3) Extrapolate patch 1 (dynamic interactive) by moving the extrapolation handle to the left, until the result satisfies. | For each dynamic step on modification of patch 1 do:<br>▷ Extrapolate |
| 4) Select Matching command. | ▷ Activate Matching command. |
| 5) Select patch 2 as modified patch with neighbor edge to patch 1. | ▷ Mark patch 2 for Matching as modification patch. |
| 6) Select patch 1 as reference patch with neighbor edge to patch 2. | ▷ Mark patch 1 for Matching as reference patch. |
| 7) Adjust matching parameter (deactivate partly, inverse direction) | |
| 8) Activate Matching. | ▷ Match |
| 9) Select Control Point command | ▷ Activate "Control Point" command. |
| 10) Select patch 2. | ▷ Mark patch 2 for "Control Point" command. |
| 11) Move third control point row of patch 2 (dynamic interactive) using one of the line segments of the control point mesh handle, until the following matching will satisfy (this is a guess). | For each dynamic step on modification of patch 2 do:<br>▷ Adjust control points. |
| 12) Select Matching again. | ▷ Activate Matching command. |
| 13) Select patch 2 as modified patch with neighbor edge to patch 1. | ▷ Mark patch 2 for Matching as modification patch. |
| 14) Select patch 1 as reference patch with neighbor edge to patch 2. | ▷ Mark patch 1 for Matching as reference patch. |
| 15) Activate Matching. | ▷ Match |
| Repeat step 9 and 15 until result satisfies. | |

Fig. 2
Prior Art

Class A System with parallel commands

| User | Main Command, Slot |
|---|---|
| 1) Select "Control Point" command. | ➤ Include "Control Point" command into the active command table.<br>➤ Activate "Control Point" command. |
| 2) Select patch 1. | ➤ Include patch 1 into geometry table (slot) and mark it for active command "Control Point".<br>➤ Send "Update 3D Handles" notification to "Control Point" command. |
| 3) Select patch 2. | ➤ Include patch 2 into geometry table (slot) and mark it for active command "Control Point".<br>➤ Send "Update 3D Handles" notification to "Control Point" command. |
| 4) Select Matching command. | ➤ Include Matching command into the active command table.<br>➤ Activate Matching command. |
| 5) Select patch 2 as modified patch with neighbor edge to patch 1. | ➤ Mark patch 2 in geometry table for active command Matching as modification patch.<br>➤ Send "Update 3D Handles" notification to Matching command. |
| 6) Select patch 1 as reference patch with neighbor edge to patch 2. | ➤ Mark patch 1 in geometry table for active command Matching as reference patch.<br>➤ Send "Update 3D Handles" notification to Matching command. |
| 7) Select Extrapolation command. | ➤ Include Extrapolation command into the active command table.<br>➤ Activate Extrapolation command. |
| 8) Select patch1. | ➤ Mark patch 1 in geometry table for active command Extrapolation.<br>➤ Send "Update 3D Handles" notification to Extrapolation command. |
| 9) Extrapolate patch 1 (dynamic interactive) by moving the extrapolation handle to the left, until the result satisfies. | For each dynamic step on modification of patch 1 do:<br>➤ Check all commands marked on patch 1:<br>  • Found Matching.<br>    ▪ Send "Update 3D Handles" notification to Matching.<br>  • Found "Control Point Modification".<br>    ▪ Send "Update 3D Handles" notification to "Control Point Modification".<br>  • Found Extrapolation.<br>    ▪ Send "Update 3D Handles" notification to Extrapolation.<br>➤ Finish dynamic step. |
| 10) Activate Matching by clicking on the matching handle | ➤ Check all commands marked on patch 2:<br>  • Found Matching.<br>    ▪ Send "Update 3D Handles" notification to Matching.<br>  • Found Control Point Modification.<br>    ▪ Send "Update 3D Handles" notification to "Control Point". |
| 11) Move third control point row of patch 2 (dynamic interactive) using one of the line segments of the control point mesh handle, until the following matching will satisfy (this is a guess). | For each dynamic step on modification of patch 2 do:<br>➤ Check all commands marked on patch 2:<br>  • Found Matching.<br>    ▪ Send "Update 3D Handles" notification to Matching.<br>  • Found Control Point Modification.<br>    ▪ Send "Update 3D Handles" notification to "Control Point".<br>➤ Finish dynamic step (patch 2 already handled). |
| 12) Activate Matching again by clicking on the matching handle | ➤ Check all commands marked on patch 2:<br>  • Found Matching.<br>    ▪ Send "Update 3D Handles" notification to Matching.<br>  • Found Control Point Modification.<br>    ▪ Send "Update 3D Handles" notification to "Control Point". |
| Repeat step 11 and 12 until result satisfies. | |

Fig. 3

Class A system with parallel and associative commands

| User | Main Command, Slot |
|---|---|
| 1) Select "Control Point" command. | ➢ Include "Control Point" command into the active command table.<br>➢ Activate "Control Point" command. |
| 2) Select patch 1. | ➢ Include patch 1 into geometry table (slot) and mark it for active command "Control Point".<br>➢ Send "Update 3D Handles" notification to "Control Point" command. |
| 3) Select patch 2. | ➢ Include patch 2 into geometry table (slot) and mark it for active command "Control Point".<br>➢ Send "Update 3D Handles" notification to "Control Point" command. |
| 4) Select Matching command. | ➢ Include Matching command into the active command table and mark it as associative command.<br>➢ Activate Matching command. |
| 5) Select patch 2 as modified patch with neighbor edge to patch 1. | ➢ Mark patch 2 in geometry table for active command Matching as modification patch.<br>➢ Send "Update 3D Handles" notification to Matching command. |
| 6) Select patch 1 as reference patch with neighbor edge to patch 2. | ➢ Mark patch 1 in geometry table for active command Matching as reference patch.<br>➢ Send "Update 3D Handles" notification to Matching command. |
| 7) Select Extrapolation command. | ➢ Include Extrapolation command into the active command table.<br>➢ Activate Extrapolation command. |
| 8) Select patch1. | ➢ Mark patch 1 in geometry table for active command Extrapolation.<br>➢ Send "Update 3D Handles" notification to Extrapolation command. |
| 9) Extrapolate patch 1 (dynamic interactive) by moving the extrapolation handle to the left, until the result satisfies. | For each dynamic step on modification of patch 1 do:<br>➢ Check all commands marked on patch 1:<br>• Found Matching (associative).<br>▪ Activate Matching Action.<br>▪ Mark Patch 2 as modified (by Matching).<br>▪ Send "Update 3D Handles" notification to Matching.<br>• Found "Control Point Modification".<br>▪ Send "Update 3D Handles" notification to "Control Point Modification".<br>• Found Extrapolation.<br>▪ Send "Update 3D Handles" notification to Extrapolation.<br>➢ Look for patches modified by associative commands:<br>➢ Found patch 2.<br>➢ Check all commands marked on patch 2:<br>• Found Matching (associative).<br>▪ No Action, because matching itself modified patch 2.<br>▪ Send "Update 3D Handles" notification to Matching.<br>• Found Control Point Modification.<br>▪ Send "Update 3D Handles" notification to "Control Point Modification".<br>➢ Finish dynamic step. |
| 10) Move third control point row of patch 2 (dynamic interactive) using one of the line segments of the control point mesh handle, until the result satisfies. | For each dynamic step on modification of patch 2 do:<br>➢ Check all commands marked on patch 2:<br>• Found Matching (associative).<br>▪ Activate Matching Action.<br>▪ Send "Update 3D Handles" notification to Matching.<br>• Found Control Point Modification.<br>▪ Send "Update 3D Handles" notification to "Control Point".<br>➢ Look for patches modified by associative commands:<br>➢ Found patch 2.<br>➢ Finish dynamic step (patch 2 already handled). |

Fig. 4

Class A system with parallel commands, associative commands and scene storage

| User | Main Command, Slot |
|---|---|
| 1) Select stored scene. | ➢ Reactivate all scene commands (Control Point, Matching, Extrapolation) with associated geometry selections and tool representations from the stored scene. |
| 2) Extrapolate patch 1 (dynamic interactive) by moving the extrapolation handle to the left, until the result satisfies. | For each dynamic step on modification of patch 1 do:<br>➢ Check all commands marked on patch 1:<br>  • Found Matching (associative).<br>    ▪ Activate Matching Action.<br>    ▪ Mark Patch 2 as modified (by Matching).<br>    ▪ Send "Update 3D Handles" notification to Matching.<br>  • Found "Control Point Modification".<br>    ▪ Send "Update 3D Handles" notification to "Control Point Modification".<br>  • Found Extrapolation.<br>    ▪ Send "Update 3D Handles" notification to Extrapolation.<br>➢ Look for patches modified by associative commands:<br>➢ Found patch 2.<br>➢ Check all commands marked on patch 2:<br>  • Found Matching (associative).<br>    ▪ No Action, because matching itself modified patch 2.<br>    ▪ Send "Update 3D Handles" notification to Matching.<br>  • Found Control Point Modification.<br>    ▪ Send "Update 3D Handles" notification to "Control Point Modification".<br>➢ Finish dynamic step. |
| 3) Move third control point row of patch 2 (dynamic interactive) using one of the line segments of the control point mesh handle, until the result satisfies. | For each dynamic step on modification of patch 2 do:<br>➢ Check all commands marked on patch 2:<br>  • Found Matching (associative).<br>    ▪ Activate Matching Action.<br>    ▪ Send "Update 3D Handles" notification to Matching.<br>  • Found Control Point Modification.<br>    ▪ Send "Update 3D Handles" notification to "Control Point".<br>➢ Look for patches modified by associative commands:<br>➢ Found patch 2.<br>➢ Finish dynamic step (patch 2 already handled). |

Fig. 5

FREEFORM MODELING METHOD AND SYSTEM

BACKGROUND

The present invention relates to the field computer-aided design (CAD), computer aided manufacturing (CAM), and computer aided engineering (CAE), and more particularly to systems and methods for performing freeform modeling operations in this field.

In the field of design, freeform modeling is employed to model solids or surfaces with respect to given aesthetic, functional, engineering or manufacturing constraints. Surface modeling is a significant part of the design of products in the automotive, aerospace and consumer goods industries, among others. In the automotive industry, it plays a major role in what is known as Class A parts, that is, those surfaces that are visible to the consumer. The automotive industry employs highly skilled stylists to design such surfaces. The major part of the work performed by such personnel is usually directed towards modifications of a previously designed surface or connected set of surface entities (called patches) rather than towards re-creating new designs from scratch. The stylists interactively work on the patches through a set of commands, such as the Control Point Modification command, the Matching command, the Extrapolation command and the Offset command, until the resulting overall shape of the surface is found satisfactory from an aesthetic viewpoint, according to engineering constraints such as accuracy and technical feasibility. A modification to the geometry of one patch usually impacts other parts of the geometry. However, the user does not know in advance the overall or global effect of a local modification to a patch. Therefore, to arrive at a final design that satisfies not only the design requirements for each patch, but also satisfies the design requirements for the overall surface, the user must engage in an iterative optimization sequence by manually alternating between individual commands. This work requires hundreds, if not thousands, of commands and iterations per workday.

In known freeform modeling applications, moving from one command to the next requires most often quitting the current command, selecting a new object and launching the new command, which will be applied to the new object. Although each of these actions may appear to take little time in itself, it means a considerable burden on productivity when they have to be repeated a thousand times a day. The amount of time spent by designers just on this command switching activity may represent up to 80 percent of the designing time. There is therefore a strong demand from users for improved tools to increase the productivity in the interactive modifications of geometry in freeform modeling operations.

SUMMARY OF THE INVENTION

Accordingly, the present invention provides a system, method, and apparatus for providing greatly increased productivity in freeform modeling.

According to one aspect of the invention, this is accomplished by providing a framework by which arbitrary (including overlapping) portions of the geometry of a design can be marked so that multiple command functions for manipulating the geometry, each of which are associated with a portion of the design, will be concurrently active.

Thus, in the system of the invention, users are allowed to enter multiple selections of objects in the geometry and related multiple commands or functions. In response to these multiple selections, the system displays representations of the commands in the form of interactive tools or handles, which can be manipulated by the user. For example, upon a user's selection of a patch and of the Control Point Modification command, the system will display a grid of control points over the selected patch. Further selection of an adjacent patch and of a Matching command will result in the system displaying an arrow linking the original patch and the adjacent patch. These multiple commands are concurrently active and can be directly run by the user through manipulation of the corresponding interactive tools. Upon a user manipulation of one of the tools, the system will, as is commonly known, determine the effect of the manipulation on the geometry and display the modified geometry. According to the invention, the system also determines if the modification impacts on other active commands and, if so, the system updates the representations of the tools related to such commands. Commands that are concurrently active on arbitrary portions of the design are referred to as parallel commands.

In a further aspect of the invention, the system allows the user to declare one or more commands as associative. When a command is designated as associative, it is launched automatically with each modification of its related geometry that is caused by any other active command. Obviously, this saves additional mouse clicks. But it becomes of higher importance during dynamic interactions which are typical for surface modeling. For example, with each single control point movement (pixel-wise) all associative declared commands are updated immediately; that is, the user is in control of the global behavior of his local modifications at any time (even during dynamic interactions, which is not given in known freeform modeling applications). This aspect of the invention greatly facilitates the iterative design process, by reducing substantially the number of manual steps that a designer must perform.

According to a further aspect of the invention, the user may store the interactive scene as it is at any given time, with the current selections and tool representations, so that the work can be resumed later without the user having to redo any interactions. With this aspect of the invention the system allows the user to capture all design constraints and dependencies throughout the whole lifetime of a design model. At any time during the creation and modeling process, in addition to any modified geometry, the user may save the "how" of his modification, which means, how the result has been achieved. (Note that with this kind of User Interface storage, the system enters the 4th (time) dimension of User Interfaces in general). Such saved interactive scenes may cover (and overlap) the whole design model and can be resumed later at any given time, with all stored commands, their parameters, tool representations and selected elements, so that the user can resume his work immediately without having to redo any interactions. In a further aspect of the scene storage function, the user can map a given scene onto a similar design model. This would result in copying and pasting design constraints and dependencies on the new model, and re-applying all interactions of the scene on the new model.

According to a further aspect of the invention, a command can be declared as implicit, which is related to its selection request. Whenever such a command is launched, each geometry of currently active commands that meets the specific selection criteria becomes automatically part of the selection. The same is true for any newly created geometry as long as the implicit command stays active.

According to another aspect of the invention, users can add or remove commands and related tools to or from the list of active commands at any time. Users can also request the system to hide some of the tools or to show them.

According to another aspect of the invention, for any active command, at any time, users can add or remove elements to or from the command-specific list of selected entities.

According to another aspect of the invention, the designation of a command as associative can be turned on and off at user's request at any time.

According to another aspect of the invention, some tolerancing can be included in the execution of an associative command, in which case the execution will be considered successful if the result remains within the defined tolerance. The system advises the user accordingly, by a change in the visual representation of the related tool.

According to another aspect of the invention, where more than one command has been declared associative by the user, the system may be organized so that it executes the associative commands in a predefined sequence to minimize the risk of disturbance of potentially shared geometry.

BRIEF DESCRIPTION OF THE DRAWINGS

FIG. 2 is a table that graphically displays the steps required by a user to perform a given design task, according to a traditional Class A system.

FIG. 3 is a table that graphically displays the steps required by a user to perform a given design task, using a Class A system with parallel commands, according to the present invention.

FIG. 4 is a table that graphically displays the steps required by a user to perform a given design task, using a Class A system with parallel and associative commands, according to the present invention.

FIG. 5 is a table that graphically displays the steps that would be performed by a user, using the Class A system with parallel and associative commands of FIG. 4, when resuming use of the system after having saved a set of steps, according to the present invention.

DETAILED DESCRIPTION OF THE INVENTION

Figure 1:
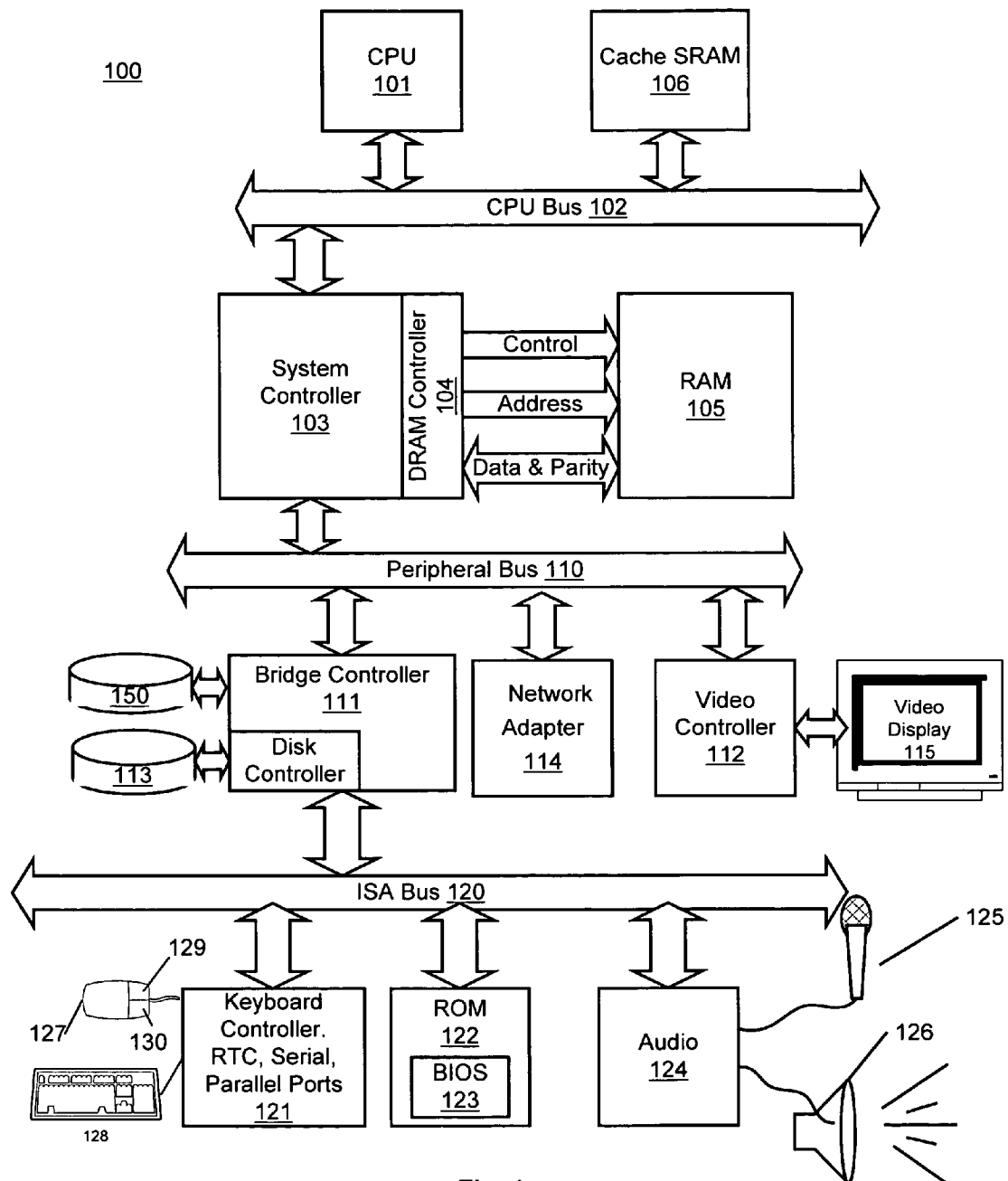
FIG. 1 is a block diagram of a computer system capable of use with the present invention.

Referring to FIG. 1, physical resources of a computer system 100 capable of use in practicing the present invention are depicted. The computer 100 has a central processor 101 connected to a processor host bus 102 over which it provides data, address and control signals. The processors 101 may be any conventional general-purpose single-chip or multi-chip microprocessor such as a Pentium® series processor, a K6 processor, a MIPS® processor, a Power PC® processor or an ALPHA® processor. In addition, the processor 101 may be any conventional special purpose microprocessor such as a digital signal processor or a graphics processor. The microprocessor 101 can have conventional address, data, and control lines coupling it to a processor host bus 102.

The computer 100 can include a system controller 103 having an integrated RAM memory controller 104. The system controller 103 can be connected to the host bus 102 and provide an interface to random access memory 105. The system controller 103 can also provide host bus to peripheral bus bridging functions. The controller 103 can thereby permit signals on the processor host bus 102 to be compatibly exchanged with signals on a primary peripheral bus 110. The peripheral bus 110 may be, for example, a Peripheral Component Interconnect (PCI) bus, an Industry Standard Architecture (ISA) bus, or a Micro-Channel bus. Additionally, the controller 103 can provide data buffering and data transfer rate matching between the host bus 102 and peripheral bus 110. The controller 103 can thereby allow, for example, a processor 101 having a 64-bit 66 MHz interface and a 533 Mbytes/second data transfer rate to interface to a PCI bus 110 having a data path differing in data path bit width, clock speed, or data transfer rate.

Accessory devices including, for example, a hard disk drive control interface 111 coupled to a hard disk drive 113, a video display controller 112 coupled to a video display 115, and a keyboard and mouse controller 121 can be coupled to a bus 120 and controlled by the processor 101. The computer system can include a connection to a computer system network, an intranet or an internet. Data and information may be sent and received over such a connection.

The computer 100 can also include nonvolatile ROM memory 122 to store basic computer software routines. ROM 122 may include alterable memory, such as EEPROM (Electronically Erasable Programmable Read Only Memory), to store configuration data. BIOS routines 123 can be included in ROM 122 and provide basic computer initialization, systems testing, and input/output (I/O) services. The BIOS 123 can also include routines that allow an operating system to be "booted" from the disk 113. Examples of high-level operating systems are, the Microsoft Windows 98™, Windows NT™, Windows 2000™, UNIX, LINUX, the Apple MacOS™ operating system, or other operating system.

An operating system may be fully loaded in the RAM memory 105 or may include portions in RAM memory 105, disk drive storage 113, or storage at a network location. The operating system can provide functionality to execute software applications, software systems and tools of software systems. Software functionality can access the video display controller 112 and other resources of the computer system 100 to provide models of objects on the video computer display 115.

EXAMPLE

The following description of an example of a simple class A modeling process shows the differences between the traditional class A CAD system with no parallel commands (FIG. 2), a system with the ability of parallel commands as described in the invention (FIG. 3), a system with the ability of parallel and associative commands (FIG. 4), also as contemplated by the invention, and a system with the ability of parallel and associative commands coupled with the ability to store and reactivate the whole interactive scene (FIG. 5), according to the present invention.

Referring to FIGS. 2, 3, 4, and 5, the modeling process is listed as single steps in a table with two columns. The left column describes user actions, and the right column describes the action of the main components in the CAD system.

The example starts with two Bezier surface patches with one common edge and activated section and curvature analysis on these patches. The goal is to move the common edge around 100 mm to the left and create a G3 (smooth curvature) transition.

Available in all three cases are individual interactive functions for extrapolation, matching, control point modification, section and curvature analysis. The matching function can only achieve a G2 (same curvature) transition (in this example). To achieve G3 transition, the third control point row (counted beginning at the common edge) is moved interactively combined with an activation of the G2 matching. These two steps must be repeated until the final result satisfies the design constraints.

In the third case (FIG. 4) the matching function is associative. Only the third 1 control point row needs to be moved, the matching is recalled on every interactive dynamic step. So the user sees the final result and can adjust the control point row directly.

Thus, focusing on FIG. 2, the first step in the process is the extrapolation of patch 1 to the left. This is done in steps 1–3 of the table. Patch 2 is then matched to patch 1 in steps 4–8. In accomplishing steps 1–8, the user must perform many operations, since in most cases the user must quit a current command to launch a new command, and must select an object for each command.

As stated above, the matching function can only achieve a G2 transition. In order to achieve a G3 transition, the third control point row must be moved. This action must be followed by another matching command. However, since the user does not know precisely what design will be achieved by those two combined steps, the user must simply make a guess each time he moves the third control point row of patch 2, and hope that the subsequent match will achieve a satisfactory design. Only through several iterations can a designer achieve a satisfactory result. Of course, each iteration requires many steps by the user for the activation and deactivation of commands, selection of objects, etc. As indicated in FIG. 2, each of steps 9–15 must be repeated until a satisfactory result is achieved.

FIG. 3 depicts an embodiment of the present invention in which parallel commands are used. In this case, the number of steps required by the user is substantially reduced. A comparison of FIGS. 2 and 3 shows that whereas in FIG. 2, each iteration (involving the movement of the third control point row followed by a matching command) requires seven steps (steps 9–15), with parallel commands the same iteration requires only two steps (steps 11–12).

Focusing on FIG. 3, it can be seen that the user is able to set up the system so that the commands he wishes to use remain active, and remain linked to the desired patches. Thus, in steps 1–3 the control point command is made active and patches 1 and 2 are marked as objects of the command. In addition, the 3D handles associated with each command are designated for automatic update each time the geometry associated with the handle changes. Similarly, in steps 4–6, the matching command is active, with patch 1 designated as reference and patch 2 as modified, and the 3D handles are designated for automatic update. Finally, in steps 7 and 8, the extrapolation command is activated for patch 1, and the corresponding 3D handle designated for update. Thus, when the extrapolation of patch 1 is done by the user in step 9, the matching, control point modification, and extrapolation 3D handles are automatically adjusted to fit the modified geometry. And in step 10, the user need only activate the matching handle of patch 2 to perform a match of patch 2 to patch 1. The 3D handles are automatically updated.

As with the system of FIG. 2, the movement of the third control point row of patch 2 must be followed by a match of patch 2 to patch 1 in iterative fashion in order to achieve a G3 transition. However, with the parallel command system of the present invention, this requires only two operations by the user. The user moves the third control point row of patch 2 in step 11, and when he does so the 3D handles and geometry are automatically updated. He then simply activates matching, and again the geometry and 3D handles are automatically updated. Thus the iterative portion of the design process is much easier and less time consuming to accomplish.

In FIG. 4, the system of the invention using both parallel and associative commands is depicted. In this case, the number of steps required by the user is reduced even further. In this system, the iteration required for achieving a satisfactory design with a G3 transition (involving the movement of the third control point row followed by a matching command) requires repeating just one step (step 10), i.e., moving the third control point row of patch 2. All other necessary steps are performed automatically.

Focusing on FIG. 4, steps 1–8, the user sets up active commands, and marks the appropriate patches for action, just as was done in FIG. 3, steps 1–8. However, in step 4, the matching command is also designated as being "associative," which means that it will be launched automatically with each modification of the geometry to which it is related. In this case, any time patch 1 is modified, the matching command will automatically match patch 2 to patch 1. Therefore, in step 9, when the user extrapolates patch 1 by moving the extrapolation handle of patch 1, patch 2 is automatically matched to patch 1. More significantly, when the user in step 10 moves the third control point row of patch 2, patch 2 is then automatically re-matched to patch 1 without any further action by the user. Therefore, the user can simply continue to move the third control point row until a suitable G3 transition is achieved. No further steps are required.

As stated, the system allows the user to save the design at any stage, so the user can leave a project, and later resume the project without repeating any steps. Focusing on FIG. 4, for example, the user could stop after completing step 8, and return later, picking up at step 9, without having to redo any of steps. This is depicted in FIG. 5, where the user reactivates an already setup scene from an earlier session.

The example illustrates the vast improvement in productivity that is achieved with the present invention.

The Update Process

Figure 6:
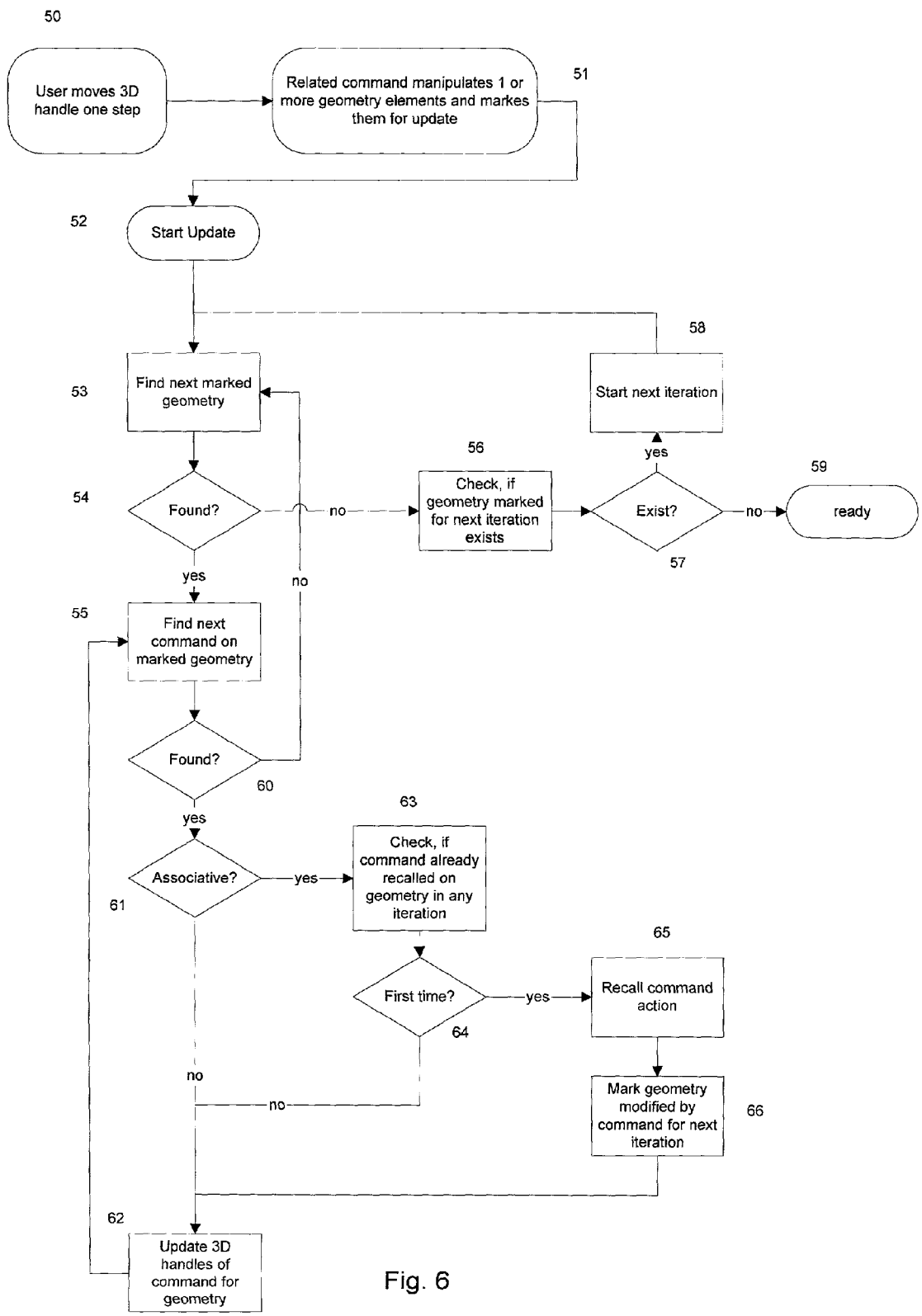
FIG. 6 is a schematic representation, in flow chart form, of a method for updating 3D handles, and executing associative commands, according the preferred embodiment of the invention.

A process for updating the parallel and associative commands according to a preferred embodiment of the invention is depicted in FIG. 6. When the user moves a 3D handle (step 50), the command related to the handle is executed by manipulating the geometry element or elements related to the handle, and the 3D handle is marked for update (step 51). Updating a 3D handle is accomplished by the system by moving the 3D handle so that it maintains its position with respect to the geometry. Since the geometry has been modified, the 3D handle must be moved also.

The update process is then begun (step 52), and the system looks for marked geometry (step 53). If one is found, then the system looks for a command on the marked geometry (step 55). If a command is found, a query is made as to whether the command is associative (step 61). If it is not, then the 3D handle for the command on the geometry in question is updated (step 62), and the system looks for the next command on the geometry (step 55). If, in step 61, it is determined that the command is associative, then the system checks to see if the command has already been performed with respect to the geometry in question in any iteration (step 63). If so, (step 64, no), then the command is not performed again; instead the 3D handle is updated just as if the command were not associative. However, if the command has not yet been performed (step 64, yes), then the command is performed on the appropriate geometry (step 65), the geometry is flagged to indicate that the command has already been performed (step 66), the geometry on which the command has been performed is marked for the next iteration (step 66), and the 3D handle is updated (step 62). The process is repeated for each command on the marked geometry until all commands have been processed, in which case no more commands will be found (step 60, no). The system will then check for the next marked geometry (step 53), and if one is found all commands for that geometry will be processed as indicated above. If no further marked geometries are found (step 54, no), then the system checks for geometry that has been marked for the next iteration (step 56). If one is found, then the process begins for the next iteration, (step 58). Otherwise, the update process is complete (steps 57, 59), to begin again in the event that the user moves a 3D handle.

Invention Component Description

Figure 7:
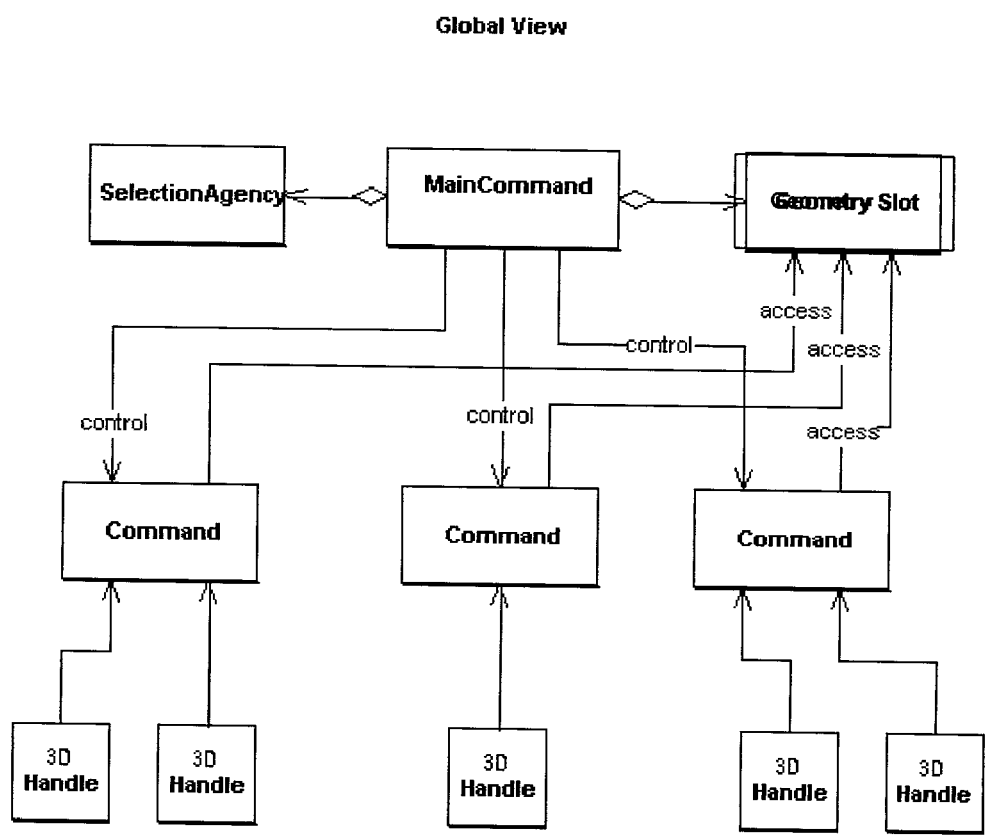
FIG. 7 is a schematic representation of an aspect of the method of the preferred embodiment of the invention.

Components of the preferred embodiment of the invention are now described with reference to FIG. 7, which is a global view of the structure of the system of the present invention.

Parallel and associative commands are managed by the main command assisted by the geometry slot and the selection agency. The main command handles and administers all individual command interactions, serves parallel commands with update events and asks associative commands to re-run if necessary.

Since a given geometry element can be the subject of two or more commands simultaneously, a centralized geometry access (to avoid data overwriting) as well as a global update mechanism (to update 3D handles) is required, which is the task of the geometry slot. The selection agency manages all incoming selection requests and serves the geometry slot with the command-specific geometry elements.

Each individual command is mainly controlled by the user through 3D handles on the geometry elements. As stated, manipulation of the 3D handles, for example by positioning a cursor over the handle, clicking a mouse to activate the handle, and moving the handle, typically causes a change in the geometry of the patch to which the handle is related. As a result of the parallelism of individual commands, many different 3D handles may be visible on geometry elements in the 3D view. The implementation must give a unique look for 3D handles dedicated for a specific command, so the user directly associates a 3D handle to functionality, implemented through a specific command. Therefore one general rule exists, namely, that each specific 3D handle is dedicated to one and only one specific command. However, each geometry element may be accessed by different commands at the same time.

The components will now be further described.

3D Handles 3D handles are geometric User Interface objects, which may be directly manipulated by the user (like buttons and sliders in a 2D panel dialog). Each movement event of a handle is sent to the related individual command, which manipulates the underlying geometry element (or elements) accordingly to its functionality.

Since multiple commands may be active on the same geometry elements and most of the 3D handles are positioned directly on the geometry, the manipulation of geometry by a specific individual command must somehow inform all other commands which deal with that geometry element that their associated 3D handles must be updated. This is done through the global update process in the main command on each dynamic step (event) of an individual command.

Commands

An individual command reacts on 3D handle modifications and changes the geometry data accessed through the common geometry slot accordingly to its specific functionality. It then activates the general update process of the main command. This is done on each interactive step (on each movement event of the mouse or other possible input devices).

An individual command may also act as a server for the main command, i.e., update 3D handles, and re-run the command if flagged as associative. Of course, those interface functions access the geometry through the common geometry slot, described below.

Geometry Slot

The geometry slot is a large table of all selected geometry elements for all active commands. For each geometry element it stores a list of commands that have been associated with the geometry element, and a set of flags showing the state of the geometry element with respect to each command associated with the element. The geometry slot also contains a table of all active commands. For each command it stores the command identifier and the attributes of the command, i.e., whether it is associative or not.

The Geometry Slot has mainly two classes of interface functions: 1) add, remove, or modify geometry elements (modify the geometry table), and 2) iterative and direct access functions for all individual commands and for the general update process of the main command.

Selection Agency

The selection agency serves all user selection for all individual commands. Individual commands only distribute so-called selection requests to the selection agency, which keep the information of the command identifier of the calling command, the geometry type, the number of requested elements and other attributes for the selection agency to set up an interactive selection mode. Selection requests are also used to store results of the selection and will be used by the geometry slot for adding geometry elements. Although the selection agency is shown in FIG. 7 conceptually as separate from the main command, it can be thought of as part of the main command, serving an administrative function.

Main Command

The main command is responsible for the lifetime of all individual commands, the initialization of the geometry slot, and entering the results of the selection from the selection agency into the geometry slot.

The main interface function (related to this invention) is the global update function, initiated by each individual command on each dynamic step. The global update function is the main service function to ensure that parallel commands work well together, especially if individual commands work on the same geometry. Also it ensures, that associative commands are recalled to related geometry changes.

It is to be understood that the foregoing method can be applied to any system for designing objects, including any CAD/CAM/CAE system. The invention may be implemented in digital electronic circuitry, or in computer hardware, firmware, software, or in combinations of them. Apparatus of the invention may be implemented in a computer program product tangibly embodied in a machine-readable storage device for execution by a programmable processor; and method steps of the invention may be performed by a programmable processor executing a program of instructions to perform functions of the invention by operating on input data and generating output.

The invention may advantageously be implemented in one or more computer programs that are executable on a programmable system including at least one programmable processor coupled to receive data and instructions from, and to transmit data and instructions to, a data storage system, at least one input device, and at least one output device. The application program may be implemented in a high-level procedural or object-oriented programming language, or in assembly or machine language if desired; and in any case, the language may be a compiled or interpreted language.

Generally, a processor will receive instructions and data from a read-only memory and/or a random access memory. Storage devices suitable for tangibly embodying computer program instructions and data include all forms of nonvolatile memory, including by way of example semiconductor memory devices, such as EPROM, EEPROM, and flash memory devices; magnetic disks such as internal hard disks and removable disks; magneto-optical disks; and CD-ROM disks. Any of the foregoing may be supplemented by, or incorporated in, specially designed ASICs (application-specific integrated circuits).

The preferred embodiment of the present invention has been described. It will be understood that various modifications may be made without departing from the spirit and scope of the invention. Therefore, other implementations are within the scope of the following claims.

What is claimed is:

1. A computer system operation method for use with a CAD system in modeling objects, the method comprising:
    displaying a representation of an object;
    receiving input from a user specifying the attachment of at least two different graphic tools to said object, said graphic tools each representing a command function for modifying the geometry of the object; and
    displaying said graphic tools attached to said representation of said object, wherein each of said graphic tools is concurrently active, so that modification of any of said graphic tools by the user will cause its associated command function to modify the geometry of the object.

2. The computer system operation method of claim 1, wherein the method further comprises:
    receiving input from a user specifying that one or more command functions be executed automatically upon modification of the geometry to which said command function is attached; and
    executing said one or more command functions designated for automatic execution upon modification of the geometry to which it is attached.

3. The computer system operation method of claim 1, wherein the method further comprises:
    receiving input from a user specifying that the system operation be suspended; saving the geometry and inputs received by the user immediately prior to receiving said suspension input from the user;
    suspending operation of the system;
    receiving input from the user that the system resume operation;
    retrieving said stored geometry and inputs; and
    resuming operation of said system using said stored information.

4. A computer system operation method for use with a CAD system in modeling objects, the method comprising:
    displaying a representation of an object;
    receiving input from a user specifying the attachment of graphic tools to said object, said graphic tools each representing a command function for modifying the geometry of the object;
    displaying said graphic tools attached to said representation of said object, wherein each of said graphic tools is concurrently active, so that modification of any of said graphic tools by the user will cause its associated command function to modify the geometry of the object;
    receiving input from a user specifying that a user interface, comprising commands for modifying the geometry of said object, be saved; and
    saving said user interface as it exists at the time said saving input is received.

5. The computer system operation method of claim 4, wherein the method further comprises:
    receiving input from a user specifying that a previously saved user interface be retrieved;
    retrieving said user interface;
    receiving user input specifying that said user interface be applied to an object selected by the user; and
    applying said user interface to said object selected by the user.

6. A computer system operation method for use with a CAD system in modeling objects, the method comprising:
    displaying a representation of an object;
    receiving input from a user specifying the attachment of at least two graphic tools to said object, said graphic tools each representing a command function for modifying the geometry of the object;
    displaying said graphic tools attached to said representation of said object, wherein each of said graphic tools is concurrently active, so that modification of any of said graphic tools by the user will cause its associated command function to modify the geometry of the object; and
    modifying the display of said one or more graphic tools whenever the object to which it is attached is modified.

7. A CAD/CAM apparatus comprising:
    an input device;
    a central processing unit; and
    a display device;
    wherein the central processing unit runs an application program comprising code for:
    displaying a representation of an object;
    receiving user input specifying the placement on said object of at least two different graphical tools representing command functions for modifying the geometry of the object;
    displaying said graphical tools in response to said input;
    receiving input from a user modifying one of said graphical tools; and modifying the geometry of said object in accordance with the command function associated with the graphical tool, wherein each of said graphical tools is concurrently active on said geometry.

8. The CAD/CAM apparatus of claim 7, wherein the application program further comprises code for:

receiving input from a user specifying that one or more command functions be executed automatically upon modification of the geometry to which said command function is attached; and executing said one or more command functions designated for automatic execution upon modification of the geometry to which it is attached.

9. The CAD/CAM apparatus of claim 7, wherein the application program further comprises code for:

receiving input from a user specifying that the system operation be suspended; saving the geometry and inputs received by the user immediately prior to receiving said suspension input from the user;

suspending operation of the system;

receiving input from the user that the system resume operation;

retrieving said stored geometry and inputs; and resuming operation of said system using said stored information.

10. Computer executable code stored on a computer readable medium, the code comprising means for causing a computer to take steps comprising: displaying a representation of an object;

receiving input from a user specifying the attachment of at least two different graphic tools to said object, said graphic tools each representing a command function for modifying the geometry of the object;

displaying said graphic tools attached to said representation of said object, wherein each of said graphic tools is concurrently active, so that modification of any of said graphic tools by the user will cause its associated command function to modify the geometry of the object.

11. Computer executable code stored on a computer readable medium according to claim 10, said code further comprising means for causing a computer to take steps comprising:

receiving input from a user specifying that one or more command functions be executed automatically upon modification of the geometry to which said command function is attached; and executing said one or more command functions designated for automatic execution upon modification of the geometry to which it is attached.

12. Computer executable code stored on a computer readable medium according to claim 10, said code further comprising means for causing a computer to take steps comprising:

receiving input from a user specifying that the system operation be suspended; saving the geometry and inputs received by the user immediately prior to receiving said suspension input from the user;

suspending operation of the system;

receiving input from the user that the system resume operation;

retrieving said stored geometry and inputs; and resuming operation of said system using said stored information.

13. A computer system operation method for use with a CAD system in modeling objects, the method comprising: displaying a representation of an object;

receiving input from a user specifying the attachment of at least two graphic tools to a portion of said object, said graphic tools each representing a command function for modifying the geometry of the object;

displaying said graphic tools attached to said portion of said object, wherein each of said graphic tools is concurrently active, so that modification of any of said graphic tools by the user will cause its associated command function to modify said portion of the geometry of the object.

14. A CAD/CAM apparatus comprising:

an input device;

a central processing unit; and a display device;

wherein the central processing unit runs an application program comprising code for:

displaying a representation of an object;

receiving user input specifying the placement of at least two graphical tools representing a command function for modifying the geometry of the object, on a portion of said object;

displaying said graphical tools in response to said input; receiving input from a user modifying one of said graphical tools; and modifying said portion of the geometry of said object in accordance with the command function associated with the graphical tool, wherein each of said graphical tools is concurrently active on said portion of said geometry.

15. Computer executable code stored on a computer readable medium, the code comprising means for causing a computer to take steps comprising: displaying a representation of an object;

receiving input from a user specifying the attachment of at least two graphic tools to a portion of said object, said graphic tools each representing a command function for modifying the geometry of the object; and displaying said graphic tools attached to said portion of said object, wherein each of said graphic tools is concurrently active, so that modification of any of said graphic tools by the user will cause its associated command function to modify said portion of the geometry of the object.

* * * * *